United States Patent
Kiyota (10) Patent No.: US 9,088,132 B2
(45) Date of Patent: Jul. 21, 2015

(54) SEMICONDUCTOR OPTICAL ELEMENT, INTEGRATED SEMICONDUCTOR OPTICAL ELEMENT, AND SEMICONDUCTOR OPTICAL ELEMENT MODULE

(71) Applicant: Furukawa Electric Co., Ltd., Tokyo (JP)

(72) Inventor: Kazuaki Kiyota, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 75 days.

(21) Appl. No.: 14/074,209

(22) Filed: Nov. 7, 2013

(65) Prior Publication Data

US 2014/0055842 A1  Feb. 27, 2014

Related U.S. Application Data

(63) Continuation of application No. PCT/JP2013/051892, filed on Jan. 29, 2013.

(30) Foreign Application Priority Data

Jan. 30, 2012  (JP) ................. 2012-017174

(51) Int. Cl.
*H01S 5/10* (2006.01)
*B82Y 20/00* (2011.01)
(Continued)

(52) U.S. Cl.
CPC ............. *H01S 5/1014* (2013.01); *B82Y 20/00* (2013.01); *H01S 5/101* (2013.01); *H01S 5/0202* (2013.01);
(Continued)

(58) Field of Classification Search
CPC ............................. H01S 5/101; H01S 5/1014
See application file for complete search history.

(56) References Cited

U.S. PATENT DOCUMENTS 5,392,308 A  *  2/1995  Welch et al. ................. 372/92
5,539,571 A  *  7/1996  Welch et al. ................. 359/344
(Continued)

FOREIGN PATENT DOCUMENTS

JP  H05-067845 A  3/1993
JP  2000-019345 A  1/2000
(Continued)

OTHER PUBLICATIONS

International Search Report mailed Feb. 26, 2013 for PCT/JP2013/051892 filed on Jan. 29, 2013 with English Translation.
(Continued)

*Primary Examiner* — Ari M Diacou
(74) *Attorney, Agent, or Firm* — Oblon, McClelland, Maier & Neustadt, L.L.P.

(57) ABSTRACT

A semiconductor optical element includes an optical waveguide formed on a semiconductor substrate, which includes: a single mode guide portion which guides input light in a single mode; a curved portion disposed at a downstream side of the single mode guide portion in a waveguide direction of the light and guiding the light in a single mode; and a flared portion disposed at a downstream side of the curved portion in the waveguide direction and of which waveguide width is widened toward the waveguide direction, so that the flared portion can guide the light in a single mode at an light-input side and the flared portion can guide the light in a multi-mode at a light-output side. The input light is optically-amplified by each of the active layers in the single mode guide portion, the curved portion and the flared portion by an optically-amplifying effect of the active layers.

9 Claims, 4 Drawing Sheets

(51) Int. Cl.
*H01S 5/227* (2006.01)
*H01S 5/02* (2006.01)
*H01S 5/022* (2006.01)
*H01S 5/026* (2006.01)
*H01S 5/06* (2006.01)
*H01S 5/065* (2006.01)
*H01S 5/12* (2006.01)
*H01S 5/22* (2006.01)
*H01S 5/343* (2006.01)
*H01S 5/40* (2006.01)

(52) U.S. Cl.
CPC ........... *H01S 5/0265* (2013.01); *H01S 5/02284* (2013.01); *H01S 5/0612* (2013.01); *H01S 5/0655* (2013.01); *H01S 5/1085* (2013.01); *H01S 5/12* (2013.01); *H01S 5/2201* (2013.01); *H01S 5/227* (2013.01); *H01S 5/2222* (2013.01); *H01S 5/34306* (2013.01); *H01S 5/4012* (2013.01)

(56) References Cited

U.S. PATENT DOCUMENTS

| | | | | |
|---|---|---|---|---|
| 5,793,521 | A * | 8/1998 | O'Brien et al. | 359/344 |
| 5,870,417 | A * | 2/1999 | Verdiell et al. | 372/32 |
| 6,091,755 | A * | 7/2000 | Sanders et al. | 372/92 |
| 6,411,763 | B1 * | 6/2002 | Sillard et al. | 385/129 |
| 6,556,735 | B1 | 4/2003 | Kato | |
| 6,587,629 | B1 | 7/2003 | Maruyama et al. | |
| 8,363,314 | B2 * | 1/2013 | Oh et al. | 359/344 |
| 8,472,109 | B2 * | 6/2013 | Tanaka et al. | 359/344 |
| 8,804,232 | B2 * | 8/2014 | Kim et al. | 359/344 |
| 2003/0039425 | A1 * | 2/2003 | Stoddard et al. | 385/2 |
| 2003/0219053 | A1 * | 11/2003 | Swint et al. | 372/46 |
| 2004/0136415 | A1 * | 7/2004 | Park et al. | 372/20 |
| 2007/0133990 | A1 * | 6/2007 | Kim et al. | 398/72 |
| 2009/0022194 | A1 * | 1/2009 | Watanabe et al. | 372/45.01 |
| 2009/0225801 | A1 * | 9/2009 | Mori et al. | 372/29.011 |
| 2010/0158443 | A1 | 6/2010 | Jeong | |
| 2010/0215072 | A1 * | 8/2010 | Funabashi | 372/50.12 |
| 2010/0238962 | A1 * | 9/2010 | Oh et al. | 372/45.01 |
| 2011/0310916 | A1 * | 12/2011 | Kimoto et al. | 372/20 |
| 2013/0308333 | A1 * | 11/2013 | Alphonse | 362/555 |

FOREIGN PATENT DOCUMENTS

| | | |
|---|---|---|
| JP | 2000-329956 A | 11/2000 |
| JP | 2001-111177 A | 4/2001 |
| JP | 2009-246241 A | 10/2009 |
| JP | 2010-151973 A | 7/2010 |
| JP | 2011-233829 A | 11/2011 |
| JP | 2012-004441 A | 1/2012 |
| WO | 2008/108422 A1 | 9/2008 |

OTHER PUBLICATIONS

International Written Opinion mailed Feb. 26, 2013 for PCT/JP2013/051892 filed on Jan. 29, 2013.

* cited by examiner

SEMICONDUCTOR OPTICAL ELEMENT, INTEGRATED SEMICONDUCTOR OPTICAL ELEMENT, AND SEMICONDUCTOR OPTICAL ELEMENT MODULE

CROSS-REFERENCE TO RELATED APPLICATION(S)

This application is a continuation of PCT international application Ser. No. PCT/JP2013/051892 filed on Jan. 29, 2013 which designates the United States, incorporated herein by reference, and which claims the benefit of priority from Japanese Patent Applications No. 2012-017174, filed on Jan. 30, 2012, incorporated herein by reference.

BACKGROUND OF THE INVENTION

1. Field of the Invention

The present invention relates to a semiconductor optical element, an integrated semiconductor optical element, and a semiconductor optical element module used for optical communication or the like.

2. Description of the Related Art

In optical communications, in order to compensate for attenuation of an optical signal in an optical fiber as an optical transmission path or loss of the optical signal due to optical components, an optical amplifier is used. As the optical amplifier, a semiconductor optical amplifier is promising in terms of miniaturization and integration.

As the semiconductor optical amplifiers, there are a resonance type semiconductor optical amplifier which actively uses optical resonance by reflection on an optical waveguide facet and a traveling wave type semiconductor optical amplifier where the reflection on the facet is removed to the utmost. The traveling wave type semiconductor optical amplifier has an advantage in that wavelength dependency of amplification characteristics is small.

In a semiconductor optical element including a traveling wave type semiconductor optical amplifier, in order to reduce reflection on a facet, for example, as a cleaved plane, in some cases, a structure where an optical waveguide in the vicinity of the facet is inclined with respect to the facet may be employed. In this case, a structure where a curved waveguide is installed in the vicinity of the facet, the optical waveguide at the facet is inclined with respect to the facet, and optical waveguides in the other portions are perpendicular to the facet may be employed (for example, refer to Japanese Laid-open Patent Publication No. 2001-111177).

On the other hand, the semiconductor optical amplifier has a problem in that the output power may be likely to be saturated if the optical power is large. In order to solve the problem and to increase the output optical power, in some cases, a flared structure of which waveguide width is widened as it goes to an output-side facet may be used (for example, refer to Japanese Laid-open Patent Publication No. 05-067845).

SUMMARY OF THE INVENTION

It is an object of the present invention to at least partially solve the problems in the conventional technology.

In accordance with one aspect of the present invention, a semiconductor optical element includes an optical waveguide formed on a semiconductor substrate. The optical waveguide includes: a single mode guide portion which guides input light in a single mode; a curved portion which is disposed at a downstream side of the single mode guide portion in a waveguide direction of the light and guides the light in a single mode; and a flared portion which is disposed at a downstream side of the curved portion in the waveguide direction and of which waveguide width is widened toward the waveguide direction, so that the flared portion can guide the light in a single mode at an input side of the light and the flared portion can guide the light in a multi-mode at an output side of the light. Each of the single mode guide portion, the curved portion and the flared portion includes an active layer. The input light is optically-amplified by the active layers in the single mode guide portion, the curved portion and the flared portion by an optically-amplifying effect of the active layers.

In accordance with another aspect of the present invention, an integrated semiconductor optical element includes a semiconductor optical element. The semiconductor optical element includes an optical waveguide formed on a semiconductor substrate. The optical waveguide includes: a single mode guide portion which guides input light in a single mode; a curved portion which is disposed at a downstream side of the single mode guide portion in a waveguide direction of the light and guides the light in a single mode; and a flared portion which is disposed at a downstream side of the curved portion in the waveguide direction and of which waveguide width is widened toward the waveguide direction, so that the flared portion can guide the light in a single mode at an input side of the light and the flared portion can guide the light in a multi-mode at an output side of the light. Each of the single mode guide portion, the curved portion and the flared portion includes an active layer. The input light is optically-amplified by the active layers in the single mode guide portion, the curved portion and the flared portion by an optically-amplifying effect of the active layers.

In accordance with still another aspect of the present invention, a semiconductor optical element module includes a semiconductor optical element. The semiconductor optical element includes an optical waveguide formed on a semiconductor substrate. The optical waveguide includes: a single mode guide portion which guides input light in a single mode; a curved portion which is disposed at a downstream side of the single mode guide portion in a waveguide direction of the light and guides the light in a single mode; and a flared portion which is disposed at a downstream side of the curved portion in the waveguide direction and of which waveguide width is widened toward the waveguide direction, so that the flared portion can guide the light in a single mode at an input side of the light and the flared portion can guide the light in a multi-mode at an output side of the light. Each of the single mode guide portion, the curved portion and the flared portion includes an active layer. The input light is optically-amplified by the active layers in the single mode guide portion, the curved portion and the flared portion by an optically-amplifying effect of the active layers.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, embodiments of semiconductor optical elements, integrated semiconductor optical elements, and semiconductor optical element modules according to the present invention will be described in detail with reference to the drawings. The present invention is not limited to the embodiments. In the drawings, the same components or the corresponding elements are denoted by the same reference numerals. The drawings are schematically illustrated, and thus, it should be noted that dimensional relationships or ratios of components may be different from the actual cases. In addition, it should be noted that there may be components having different dimensional relationships or ratios among the drawings.

The inventors of the present invention configured a semiconductor optical element by combining the above-described curved waveguide with the above-described flared structure in order to simultaneously implement reduction in facet reflection and improvement of the output optical power. However, in some case, there is a problem in that light in a lateral multi-mode is included in the output light, and thus, output light having a high single-mode property of a desired lateral fundamental mode is not obtained. Hereinafter, it is assumed that modes denote lateral modes.

In contrast, according to the present embodiments, it is possible to obtain an effect of simultaneously implementing reduction in facet reflection, improvement of the output optical intensity, and output light having a high single-mode property.

A first embodiment of the present invention will be described. The first embodiment is a semiconductor optical amplification element which receives light in a wavelength band of 1.55 μm, which is used for optical communication, as an input and amplifies the light to output.

Figure 1:
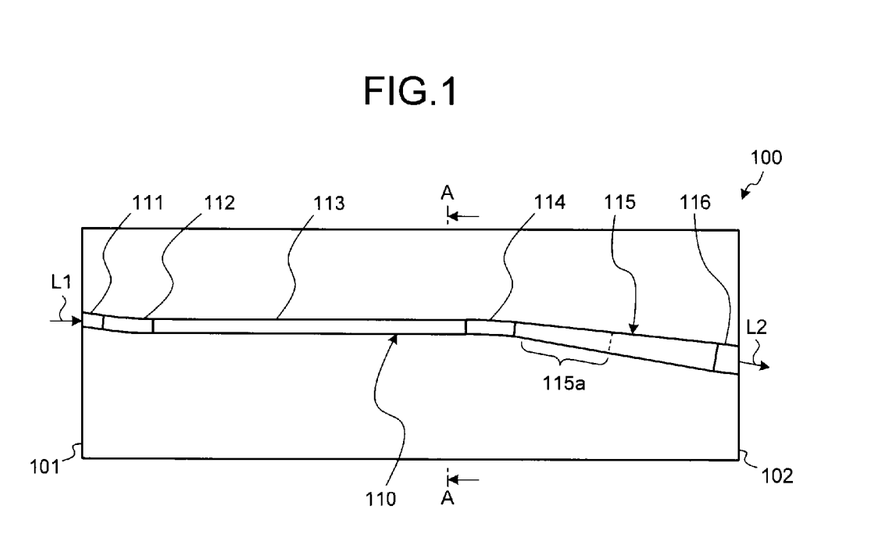
FIG. 1 is a schematic plan view illustrating a waveguide structure of a semiconductor optical amplification element according to a first embodiment.

FIG. 1 is a schematic plan view illustrating a waveguide structure of the semiconductor optical amplification element according to the first embodiment. For the description of the waveguide structure, components other than those of the waveguide structure such as a p-side electrode described later are not presented in the illustration. As illustrated in FIG. 1, a semiconductor optical amplification element 100 is configured to include a light input facet 101, a light output facet 102, and an optical amplification waveguide 110 formed between the light input facet 101 and the light output facet 102. The optical amplification waveguide 110 is configured to include an input-side linear portion 111, an input-side curved portion 112, a main linear portion 113, an output-side curved portion 114, a flared portion 115, and an output-side linear portion 116 which are sequentially connected from the light input facet 101 toward the light output facet 102.

Figure 2:
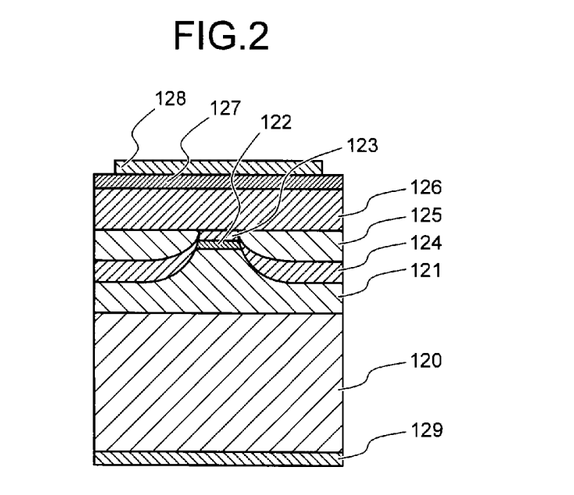
FIG. 2 is a cross-sectional view of main part taken along line A-A of FIG. 1.

FIG. 2 is a cross-sectional view of main part taken along line A-A of FIG. 1. As illustrated in FIG. 2, the semiconductor optical amplification element 100 is configured so that a lower cladding layer 121, an active layer 122 which acts as an optical waveguide, an upper cladding layer 123, a lower current blocking layer 124, an upper current blocking layer 125, an upper cladding layer 126, a contact layer 127, and a p-side electrode 128 are formed on a substrate 120 and an n-side electrode 129 is formed on the rear surface of the substrate 120.

The substrate 120 is made of n-InP of which principal surface is (001) plane. The lower cladding layer 121 is made of n-InP. The active layer 122 has a GaInAsP multi-quantum well having a separate confinement hetero-structure. A total thickness of the active layer 122 is 100 nm. The upper cladding layers 123 and 126 are made of p-InP. The lower cladding layer 121, the active layer 122, and the upper cladding layer 123 are layered in this order, so that a mesa stripe is formed. The lower current blocking layer 124 and the upper current blocking layer 125 are layered in this order to bury two sides of the mesa stripe. The lower current blocking layer 124 is made of p-InP, and the upper current blocking layer 125 is made of n-InP. The upper cladding layer 126 and the contact layer 127 are layered in this order on the upper cladding layer 123 and the upper current blocking layer 125. The contact layer 127 is made of p-GaInAs. The p-side electrode 128 is formed on the contact layer 127 and has a Ti/Pt structure. The n-side electrode 129 is made of AuGeNi.

Returning to FIG. 1, since the light input facet 101 and the light output facet 102 are formed by cleaving an epitaxial substrate where the above-described semiconductor layered structure is formed on the (001) plane of the substrate 120, the light input facet 101 and the light output facet 102 are coincident with the (110) plane of the crystal of the substrate 120. Low reflection films made of a dielectric or the like are formed on the light input facet 101 and the light output facet 102.

The input-side linear portion 111 is formed so that the one end thereof is in contact with the light input facet 101. In addition, the input-side linear portion 111 is formed so as to be inclined at an angle of 8° with respect to the <110> direction of the crystal of the substrate 120 which is the normal direction of the light input facet 101. The main linear portion 113 is extended along the <110> direction which is perpendicular to the light input facet 101 and the light output facet 102. The input-side curved portion 112 is connected to the input-side linear portion 111 and the main linear portion 113.

The flared portion 115 is formed so as to be inclined at an angle of 8° with respect to the <110> direction which is the normal direction of the light output facet 102. A waveguide width of the flared portion 115 is formed so as to be widened gradually toward the waveguide direction of the light. The output-side curved portion 114 is connected to the main linear portion 113 and the flared portion 115. The output-side linear portion 116 is formed in a state that the output-side linear portion 116 is inclined at an angle of 8° with respect to the <110> direction so that the one end thereof is in contact with the light output facet 102. Namely, the flared portion 115 and the output-side linear portion 116 are arranged on a straight line. In addition, although the inclination angle is preferably 8°, the present invention is not limited thereto.

Next, dimensions of the portions will be described. The dimensions are exemplary ones, and the present invention is not particularly limited thereto.

The input-side linear portion 111, the input-side curved portion 112, the main linear portion 113, and the output-side curved portion 114 are set so as to have substantially equal waveguide width of 2.5 μm and so as to guide light in a wavelength band of 1.55 μm in a single mode. The main linear portion 113 constitutes a single mode guide portion. The waveguide width of the flared portion 115 is widened, for example, linearly from 2.5 μm to 4 μm. The waveguide width of the output-side linear portion 116 is 4 μm.

The input-side linear portion 111 and the output-side linear portion 116 are designed to have a waveguide length of 50 μm. It is preferable that the waveguide lengths of the input-side linear portion 111 and the output-side linear portion 116 be designed to be larger than the cleaving position accuracy in the formation of the light input facet 101 and the light output facet 102. Thus, even in the case where there is an error in the cleaving position, the input-side linear portion 111 and the output-side linear portion 116 are securely formed.

The input-side curved portion 112 and the output-side curved portion 114 are curved in an arc shape, and the curvatures and waveguide lengths thereof are set so that the input-side curved portion 112 and the output-side curved portion 114 are connected to the input-side linear portion 111 and the main linear portion 113 and to the main linear portion 113 and the flared portion 115, respectively. In addition, it is preferable that the curvatures be set so that bending loss of the fundamental mode is not increased in the input-side curved portion 112 and the output-side curved portion 114. Each of the input-side curved portion 112 and the output-side curved portion 114 have a radius of curvature of 1000 μm and a waveguide length of about 120 μm. The length of the flared portion 115 is 500 μm. In addition, the total length of the semiconductor optical amplification element 100 is 1600 μm.

Next, operations of the semiconductor optical amplification element 100 will be described. By applying a voltage between the p-side electrode 128 and the n-side electrode 129, a current is injected into the active layer 122. At this time, due to the functions of the lower current blocking layer 124 and the upper current blocking layer 125, the current is efficiently injected into the active layer 122. In the state where the current is injected, if light L1 of laser light or the like in a wavelength band of 1.55 μm, which want to be amplified, is input from the light input facet 101 to the input-side linear portion 111 of the optical amplification waveguide 110, while the input-side linear portion 111, the input-side curved portion 112, the main linear portion 113, the output-side curved portion 114, the flared portion 115, and the output-side linear portion 116 of the optical amplification waveguide 110 sequentially guide the light L1, the light L1 is amplified due to the optical amplification function of the active layer 122, and is output from the output-side linear portion 116 which is in contact with the light output facet 102, as amplified light L2.

In the semiconductor optical amplification element 100, in the light input facet 101 and the light output facet 102, the input-side linear portion 111 and the output-side linear portion 116 of the optical amplification waveguide 110 are inclined with respect to the corresponding facets, so that the facets have low reflectance. For example, in the state where low reflection films are formed on the light input facet 101 and the light output facet 102, the reflectance of the light input facet 101 may be set to $10^{-4}$, and the reflectance of the light output facet 102 may be set to $10^{-6}$. If well-known window structures are employed for the light input facet 101 and the light output facet 102, the reflectance can be further reduced.

In addition, in the semiconductor optical amplification element 100, since the optical amplification waveguide 110 includes the flared portion 115, and the waveguide width thereof is widened toward the light output facet 102 side, that is, in the waveguide direction of the light. Therefore, it is possible to implement such a good output characteristic that, for example, a saturated output optical power is 20 dBm or more.

In addition, the input-side linear portion 111 which is the light input side, the input-side curved portion 112, the main linear portion 113, and the output-side curved portion 114 of the optical amplification waveguide 110 guide the input light in a single mode. On the other hand, since the flared portion 115 which is the light output side and the output-side linear portion 116 have large waveguide widths, the flared portion 115 and the output-side linear portion 116 have a structure capable of guiding the light input from the output-side curved portion 114 in a multi-mode. For example, in the case of the semiconductor material exemplified above, the waveguide width of the optical amplification waveguide 110 which acts as a single mode waveguide is 3.0 μm or less. Therefore, the portion from the input-side linear portion 111 to the position about 160 μm beyond the input side of the flared portion 115 has such a waveguide width that the optical amplification waveguide 110 can guide the light securely in a single mode; and the portion from the aforementioned position to the light output facet 102 side has such a waveguide width that the optical amplification waveguide 110 can guide the light in a multi-mode. The portion to the position about 160 μm from the input side of the flared portion 115 is referred to as a single mode portion 115a.

Herein, in the curved waveguide of the output-side curved portion 114 and the like, even though light in the fundamental mode is input, components in modes other than the fundamental mode may be excited. Particularly, this excitation is easily generated at connection portions between the curved waveguide and the linear waveguide. When such an excitation is generated, if the optical waveguide following the position of the excitation generation is a waveguide capable of guiding the light in a multi-mode, the light is guided in a multi-mode.

However, in the semiconductor optical amplification element 100 according to the first embodiment, the single mode portion 115a exists in the flared portion 115 following the output-side curved portion 114. The components in a fundamental mode excited at the connection portions before and after the output-side curved portion 114 are guided in a single mode, but the components in modes other than the fundamental mode become a radiation mode in the output-side curved portion 114 and the single mode portion 115a. Accordingly, the output-side curved portion 114 and the single mode portion 115a prevent or suppress the light components in modes other than the fundamental mode from being guided beyond the flared portion 115 or from being output from the output-side linear portion 116.

Herein, the single mode denotes that there is one waveguide mode capable of making propagation through a waveguide with respect to a specific polarization. In an ideal single mode, propagation solution of a high-order waveguide mode does not exist of itself. However, in order to obtain the effect of the present embodiment, even in the case where a high-order waveguide mode exists, a pseudo single mode having a sufficiently large power ratio to the fundamental mode is also sufficient. In the case of the pseudo single mode, it is preferable that a difference in propagation loss between the fundamental mode and the high-order mode be about 20 dB/mm or more. Therefore, in a practical design where the length of the single mode waveguide portion is about 0.5 mm, loss of 10 dB may occur in the high-order mode.

According to the above-described configuration, a single-mode property of the amplified light L2 output from the output-side linear portion 116 at the light output facet 102 is increased. In addition, since power consumption for amplification of light components in modes other than the fundamental mode is prevented or suppressed, amplification efficiency for the fundamental mode can be improved.

Figure 3:
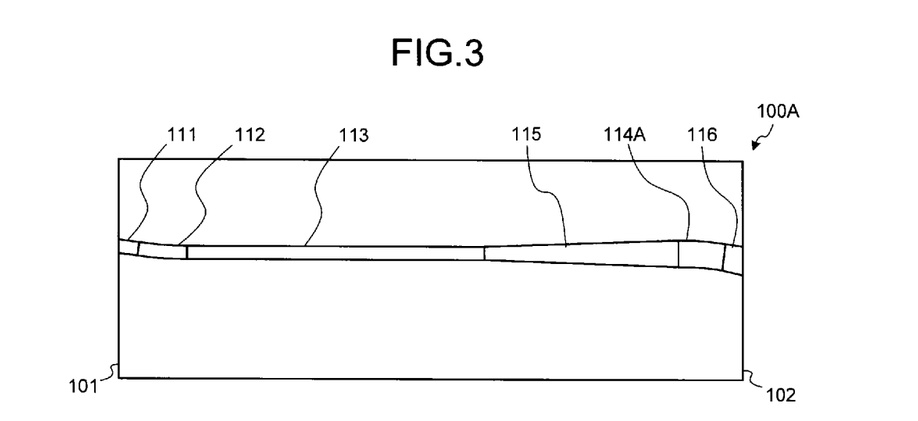
FIG. 3 is a schematic plan view illustrating a waveguide structure of a semiconductor optical amplification element according to a comparative example.

Actions of the semiconductor optical amplification element 100 according to the first embodiment will be described in detail in comparison to a comparative example. FIG. 3 is a schematic plan view illustrating a waveguide structure of a semiconductor optical amplification element according to the comparative example. A semiconductor optical amplification element 100A is different from the semiconductor optical amplification element 100 in that the flared portion 115 is directly connected to the main linear portion 113 and extended along the <110> direction and in that the flared portion 115 and the output-side linear portion 116 are connected to each other through an output-side curved portion 114A. The radius of curvature of the output-side curved portion 114A is 1000 μm; the waveguide length thereof is about 120 μm; and the waveguide width thereof is 4 μm.

In the semiconductor optical amplification element 100A, the output-side curved portion 114A, the flared portion 115, and the output-side linear portion 116, which are connected before and after the output-side curved portion 114A, can guide the light in a multi-mode. Therefore, the light components in modes other than the fundamental mode generated at the connection portions before and after the output-side curved portion 114A propagate through the output-side curved portion 114A and the output-side linear portion 116 as light in a high-order mode. While the light in a high-order mode is amplified by the output-side curved portion 114A and the output-side linear portion 116, the light in a high-order mode reaches the light output facet 102.

In this manner, the semiconductor optical amplification elements 100 and 100A are different from each other as to whether or not the light components in modes other than the fundamental mode generated due to the output-side curved portion are radiated or as to whether or not the light components propagate the following portions as light in a high-order mode.

In the case of the semiconductor optical amplification element 100A as a comparative example, since the light in a high-order mode is amplified in the optical waveguide, the power becomes larger than that of the case where the light is radiated. In addition, since the light in a high-order mode reaches the light output facet 102 as the light in a waveguide mode, in the case where the output light is to be condensed by the lens or the like, it is difficult to separate the light in a higher order mode from the light in the fundamental mode.

On the contrary, in the case of the semiconductor optical amplification element 100 according to the first embodiment, the generated light components in modes other than the fundamental mode are radiated. Therefore, the light after the radiation is not optically amplified. In addition, the position where the light is radiated is different from that of the light output facet 102. Accordingly, in the case where the amplified light in the fundamental mode output from the output-side linear portion 116 at the light output facet 102 is condensed by the lens or the like, the radiated light is not condensed at the condensing point of the amplified light in the fundamental mode. Therefore, it is easy to separate the radiated light from the amplified light in the fundamental mode. Accordingly, it is possible to obtain amplified light in a good beam pattern having a single peak.

Figure 4:
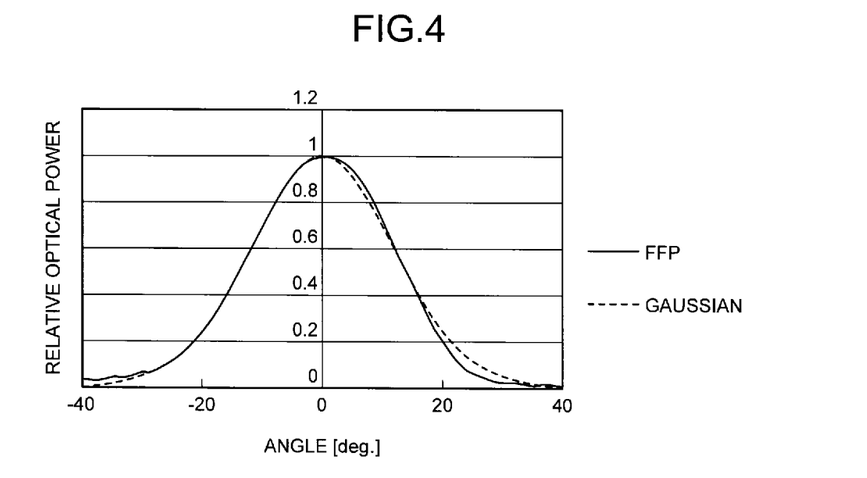
FIG. 4 is a diagram illustrating an FFP of a lateral mode of output light.

FIG. 4 is a diagram illustrating an FFP (far-field-pattern) of a lateral mode of output light output from the output-side linear portion 116 at the light output facet 102 of the semiconductor optical amplification element 100 according to the first embodiment. In FIG. 4, the measured FFP is indicated by a solid line, and a shape of a Gaussian beam for comparison to the FFP is indicated by a broken line. As illustrated in FIG. 4, it can be understood that the shape of the measured FFP is almost equal to the shape of a Gaussian beam. In this manner, the output light has a high single-mode property in a desired fundamental mode and a good beam pattern.

When the semiconductor optical amplification element 100A is to be modularized, since the output amplified light has a disturbed beam pattern due to the mixture of the light in a high-order mode, it is difficult to adjust the coupling of the light to the lens or the optical fiber. On the contrary, in the case of the semiconductor optical amplification element 100, since the amplified light has a good beam pattern, it is possible to easily perform assembling for modularization and to increase coupling efficiency to the lens or the optical fiber.

As described hereinbefore, the semiconductor optical amplification element 100 according to the first embodiment can simultaneously implement reduction in facet reflection, improvement of the output optical power, and output light having a high single-mode property.

An example of a method of manufacturing the semiconductor optical amplification element 100 according to the first embodiment will be described. First, a lower cladding layer 121 which also has a function as a buffer layer, an active layer 122, and an upper cladding layer 123 are layered in this order on the substrate 120 by using a well-known crystal growing method such as an MOCVD method.

Next, a SiNx film is deposited on the entire surface by using a plasma CVD method or the like, and after that, a mask pattern constructed with a SiNx film is formed in a shape corresponding to the shape of the optical amplification waveguide 110 by using a well-known photolithography technique and an etching technique for dielectrics. In this case, it is preferable that a mask pattern have a pattern which is corrected in terms of a side etching amount in the following semiconductor etching process.

Next, etching is performed in a range from the upper cladding layer 123 through the active layer 122 to a portion of the lower cladding layer 121 by using the mask pattern as an etching mask in a well-known method. The etching may be performed so that dry etching and wet etching are sequentially and combinationally used.

After this, the lower current blocking layer 124 and the upper current blocking layer 125 are layered in this order by using the mask pattern, which is used as the etching mask, as a selective growth mask in a well-known method such as an MOCVD method. Next, the mask pattern is peeled off, and the upper cladding layer 126 and the contact layer 127 are layered in this order by using an MOCVD method or the like.

Next, by using a photolithography technique, a resist pattern is formed, the p-side electrode 128 is deposited on the contact layer 127, and an electrode pattern is formed by lift-off. Next, the substrate 120 is polished so as to become thin down to a predetermined thickness, and the n-side electrode 129 is deposited on the rear surface of the substrate 120.

After this, the light input facet 101 and the light output facet 102 are formed by cleaving the epitaxial substrate, and low reflection films are formed on the facets. Next, elements aligned in the direction perpendicular to the cleaved facets are separated one by one. Accordingly, the semiconductor optical amplification element 100 is achieved.

Next, a second embodiment of the present invention will be described. The second embodiment is a tunable wavelength type integrated semiconductor laser element which outputs laser light in a wavelength band of 1.55 μm.

Figure 5:
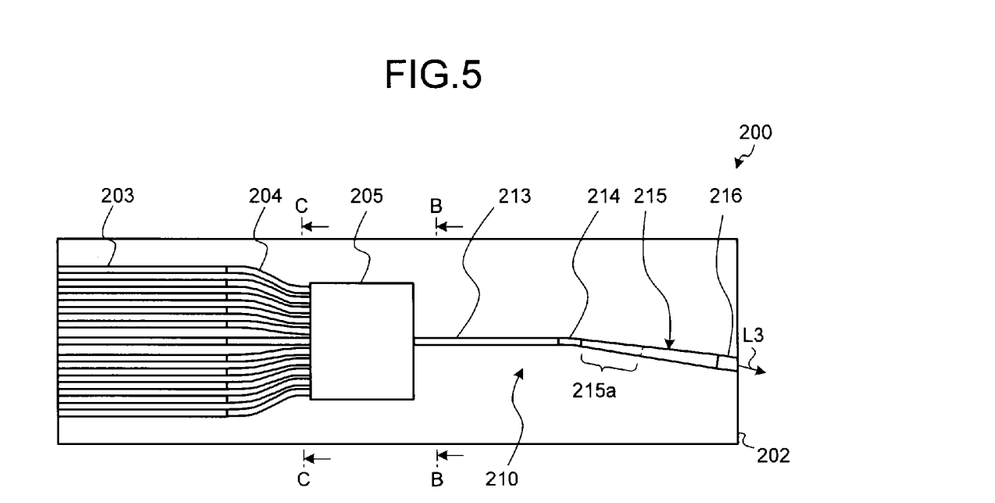
FIG. 5 is a schematic plan view illustrating a waveguide structure of an integrated semiconductor laser element according to a second embodiment.

FIG. 5 is a schematic plan view illustrating a waveguide structure of the integrated semiconductor laser element according to the second embodiment. For the description of the waveguide structure, components other than those of the waveguide structure such as a p-side electrode described later are not presented in the illustration.

As illustrated in FIG. 5, an integrated semiconductor laser element 200 has a structure where a plurality of DFB (distributed feedback) laser stripes 203, a plurality of curved waveguides 204, an MMI optical coupler 205, and a semiconductor optical amplifier 210 are integrated on one semiconductor substrate. In addition, the integrated semiconductor laser element 200 is configured to include a light output facet 202.

Figure 6:
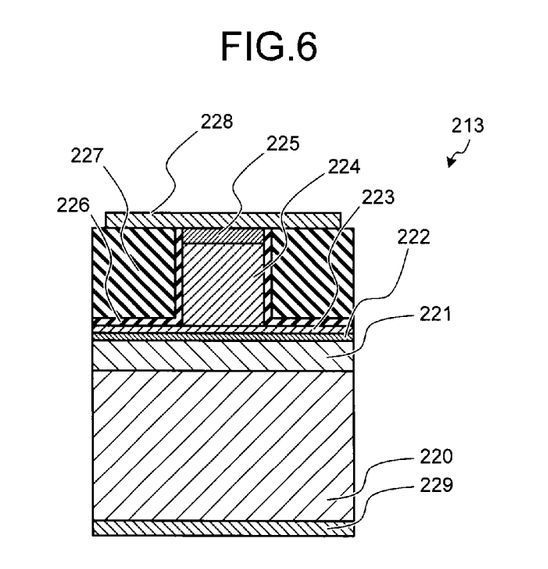
FIG. 6 is a cross-sectional view of main part taken along line B-B of FIG. 5.

FIG. 6 is a cross-sectional view of main part taken along line B-B of FIG. 5. As illustrated in FIG. 6, the semiconductor optical amplifier 210 of the integrated semiconductor laser element 200 is configured so that a lower cladding layer 221, an active layer 222 which acts as an optical waveguide, upper cladding layers 223 and 224, a contact layer 225, an insulating film 226, a planarizing polymer 227, and a p-side electrode 228 are formed on a substrate 220 and an n-side electrode 229 is formed on the rear surface of the substrate 220.

The substrate 220 is made of n-InP of which principal surface is (001) plane. The lower cladding layer 221 is made of n-InP. The active layer 222 has an AlGaInAsP multi-quantum well having a separate confinement hetero-structure. A total thickness of the active layer 222 is 150 nm. The upper cladding layers 223 and 224 are made of p-InP. The contact layer 225 is made of p-GaInAs. The upper cladding layer 224 and the contact layer 225 are layered in this order to protrude upward with respect to the upper cladding layer 223, so that a ridge structure is formed. The width of the upper cladding layer 224 corresponds to the waveguide width of the ridge waveguide. The insulating film 226 is made of SiNx to cover the surface of the upper cladding layer 223 and the side surfaces of the upper cladding layer 224 and the contact layer 225. The planarizing polymer 227 is made of polyimide to bury the upper cladding layer 224 and the contact layer 225 so that the surface of the ridge structure is planarized. The p-side electrode 228 is formed on the contact layer 225 and the planarizing polymer 227 to have a Ti/Pt structure. The n-side electrode 229 is made of AuGeNi.

Figure 7:
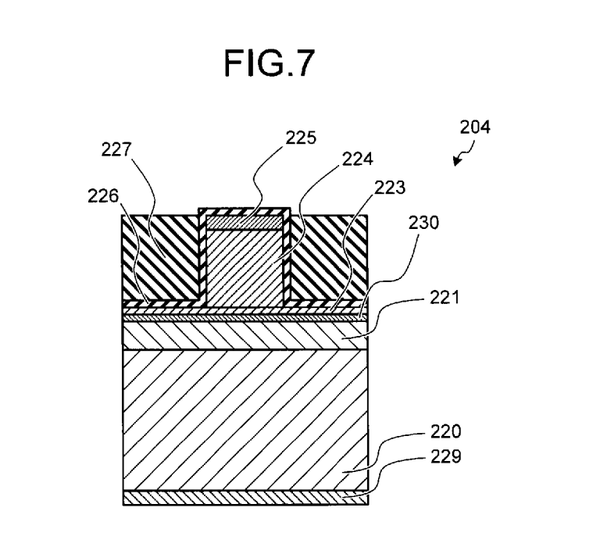
FIG. 7 is a cross-sectional view of main part taken along line C-C of FIG. 5.

FIG. 7 is a cross-sectional view of main part taken along line C-C of FIG. 5. As illustrated in FIG. 7, the curved waveguide 204 of the integrated semiconductor laser element 200 has a structure where the active layer 222 in the structure illustrated in FIG. 6 is replaced with a core layer 230 made of GaInAsP. In addition, the p-side electrode 228 is not formed, and the surface of the contact layer 225 is also covered with the insulating film 226. Herein, in the case where the wavelength where the active layer 222 has a gain is in a wavelength band of 1.55 μm, the composition of GaInAsP of the core layer 230 is set so that the core layer 230 is transparent with respect to the light in a wavelength band of 1.55 μm. The composition where the core layer 230 is transparent with respect to the light in a wavelength band of 1.55 μm is a composition where, for example, a wavelength of a band gap is 1.3 μm which is shorter than the wavelength in a wavelength band of 1.55 μm.

The cross-sectional structure of the DFB laser stripe 203 is similar to that of the semiconductor optical amplifier 210 except that a diffraction grating is formed above the active layer 222. The cross-sectional structure of the MMI optical coupler 205 is similar to that of the curved waveguide 204.

Returning to FIG. 5, since the light output facet 202 is formed by cleaving the epitaxial substrate where the above-described semiconductor layered structure is formed on the (001) plane of the substrate 220, the light output facet 202 is coincident with the (110) plane of the crystal of the substrate 220. A low reflection film made of a dielectric or the like is formed on the light output facet 202.

Each of the DFB laser stripes 203 is an edge-emitting type laser having a ridge waveguide structure having a stripe shape of which width and length are 2 μm and 600 μm, respectively. The DFB laser stripes 203 are formed with a pitch of 25 μm in the width direction at one end of the integrated semiconductor laser element 200. The DFB laser stripes 203 are configured so as for pitches between the diffraction gratings formed in the DFB laser stripes 203 to be different from each other, so that the laser oscillation wavelengths are different from each other within a range of 1530 nm to 1570 nm. In addition, the laser oscillation wavelengths of the DFB laser stripes 203 may be adjusted by changing a setting temperature of the integrated semiconductor laser element 200. In the integrated semiconductor laser element 200, a wide tunable wavelength range can be implemented by switching the driven DFB laser stripe 203 and controlling the temperature thereof.

The MMI optical coupler 205 is formed in the vicinity of a central portion of the integrated semiconductor laser element 200. Each curved waveguide 204 is formed between each of the DFB laser stripes 203 and the MMI optical coupler 205 to optically connect each of the DFB laser stripes 203 to the MMI optical coupler 205.

The semiconductor optical amplifier 210 is connected to the output side of the MMI optical coupler 205. The semiconductor optical amplifier 210 is configured to include a main linear portion 213, an output-side curved portion 214, a flared portion 215, and an output-side linear portion 216 which are connected sequentially from the MMI optical coupler 205 toward the light output facet 202.

The main linear portion 213 extends along the <110> direction which is the normal direction of the light output facet 202. The flared portion 215 is formed so as to be inclined at an angle of 8° with respect to the <110> direction which is the normal direction of the light output facet 202. A waveguide width of the flared portion 215 is formed so as to be widened gradually toward the waveguide direction of the light. The output-side curved portion 214 is connected to the main linear portion 213 and the flared portion 215. The output-side linear portion 216 is formed so that one end thereof is in contact with the light output facet 202 and so that the output-side linear portion 216 is inclined at an angle of 8° with respect to the <110> direction. Namely, the flared portion 215 and the output-side linear portion 216 are linearly arranged.

Next, dimensions of the portions of the semiconductor optical amplifier 210 will be described. The dimensions are exemplary ones, and the present invention is not particularly limited thereto.

The main linear portion 213 and the output-side curved portion 214 are set so as to have a waveguide width of 2 μm and guide light in a wavelength band of 1.55 μm in a single mode. The main linear portion 213 forms a single mode guide portion. The waveguide width of the flared portion 215 is widened, for example, linearly from 2 μm to 4 μm. The waveguide width of the output-side linear portion 216 is 4 μm.

Similarly to the first embodiment, it is preferable that the waveguide length of the output-side linear portion 216 be designed to be larger than the cleaving position accuracy in the formation of the light output facet 202. Namely, this is because, even in the case where there is an error in the cleaving position, the output-side linear portion 216 is securely formed. The output-side linear portion 216 is designed to have a waveguide length of 50 µm.

The output-side curved portion 214 is curved in an arc shape, and the curvature and waveguide length thereof are set so that the output-side curved portion 214 is connected to the main linear portion 213 and the flared portion 215. In addition, it is preferable that the curvature be set so that the bending loss of the fundamental mode is not increased in the output-side curved portion 214. The output-side curved portion 214 has a radius of curvature of 1000 µm and a waveguide length of about 120 µm. The length of the flared portion 215 is 400 µm. In addition, the total length of the semiconductor optical amplifier 210 is 1000 µm.

Next, operations of the integrated semiconductor laser element 200 will be described. First, one DFB laser stripe 203 capable of outputting laser light having a desired wavelength is selected from a plurality of the DFB laser stripes 203, and the selected DFB laser stripe 203 is driven. The optical waveguide which is optically connected to the driven DFB laser stripe 203 among a plurality of the curved waveguides 204 guides the laser light output from the driven DFB laser stripe 203 and outputs the laser light to the MMI optical coupler 205. The MMI optical coupler 205 allows the input laser light to pass through and outputs the laser light to the main linear portion 213 of the semiconductor optical amplifier 210. The semiconductor optical amplifier 210 amplifies the laser light input from the MMI optical coupler 205 and outputs the amplified light as output light L3 from the output-side linear portion 216 which is in contact with the light output facet 202. The semiconductor optical amplifier 210 is mainly used to compensate for optical loss of the laser light from the driven DFB laser stripe 203 caused by the MMI optical coupler 205 and to obtain a desired output power of laser light from the light output facet 202.

In the integrated semiconductor laser element 200, since the output-side linear portion 216 of the semiconductor optical amplifier 210 is inclined with respect to the light output facet 202, the light output facet 202 has low reflectance. For example, in the state where a low reflection film is formed on the light output facet 202, the reflectance thereof may be set to $10^{-6}$.

In addition, in the integrated semiconductor laser element 200, since the semiconductor optical amplifier 210 includes the flared portion 215, the waveguide width is widened toward the light output facet 202 side, that is, in the waveguide direction of the light. Therefore, it is possible to implement such a good output characteristic that, for example, the output optical power is 80 mW or more.

In addition, in the case of the semiconductor material exemplified above, the waveguide width of the semiconductor optical amplifier 210 as a ridge waveguide which acts as a single mode waveguide is 2.5 µm or less. Therefore, the portion from the main linear portion 213 to the position in the middle of the flared portion 215 has such a waveguide width that the semiconductor optical amplifier 210 can guide the light securely in a single mode; and the portion from the aforementioned position to the light output facet 202 side has such a waveguide width that the semiconductor optical amplifier 210 can guide the light in a multi-mode. In the flared portion 215, a portion having such a waveguide width that the portion can guide the light securely in a single mode is referred to as a single mode portion 215a.

Similarly to the first embodiment, in the integrated semiconductor laser element 200 according to the second embodiment, the single mode portion 215a exists in the flared portion 215 following the output-side curved portion 214. Therefore, the components in a fundamental mode excited at the connection portions in the front and rear of the output-side curved portion 214 are guided in a single mode, but the components in modes other than the fundamental mode become a radiation mode in the output-side curved portion 214 and the single mode portion 215a. Accordingly, the output-side curved portion 214 and the single mode portion 215a prevent the light components in modes other than the fundamental mode from being guided beyond the flared portion 215 or from being output from the output-side linear portion 216.

Herein, the single mode denotes that there is one waveguide mode capable of making propagation through a waveguide with respect to a specific polarization. In an ideal single mode, propagation solution of a high-order waveguide mode does not exist. However, in order to obtain the effect of the present embodiment, even in the case where a high-order waveguide mode exists, a pseudo single mode having a sufficiently large power ratio to the fundamental mode is also sufficient. In the case of the pseudo single mode, it is preferable that a difference in propagation loss between the fundamental mode and the high-order mode is about 20 dB/mm or more. Therefore, in a practical design where the length of the single mode waveguide portion is about 0.5 mm, loss of 10 dB may occur in the high-order mode.

According to the above-described configuration, a single-mode property of the output light L3 output from the output-side linear portion 216 at the light output facet 202 is increased. In addition, since power consumption for amplification of light components in modes other than the fundamental mode is prevented or suppressed, amplification efficiency for the fundamental mode can be improved.

In addition, similarly to the first embodiment, light components in modes other than the fundamental mode generated at the connection portions in the front and rear of the output-side curved portion 214 are radiated, and the position where the light is radiated is different from that of the light output facet 202. Accordingly, in the case where the output light in the fundamental mode output from the output-side linear portion 216 at the light output facet 202 is condensed by the lens or the like, the radiated light is not condensed at the condensing point of the output light in the fundamental mode. Therefore, it is easy to separate the radiated light from the output light in the fundamental mode. Accordingly, it is possible to obtain output light in a good beam pattern having a single peak. Therefore, it is possible to easily perform assembling for modularization and to increase the efficiency of coupling to the lens or the optical fiber.

As described hereinbefore, the integrated semiconductor laser element 200 according to the second embodiment can simultaneously implement reduction in facet reflection, improvement of the output optical power, and output light having a high single-mode property.

Now, an example of a method of manufacturing the integrated semiconductor laser element 200 according to the second embodiment will be described. First, a lower cladding layer 221 which also has a function as a buffer layer, an active layer 222, an upper cladding layer 223, and a GaInAsP grating layer (not shown) are layered on the substrate 220 in this order by using a well-known crystal growing method such as an MOCVD method.

Next, a SiNx film is deposited on the entire surface by using a plasma CVD method or the like, and after that, patterning is performed on the SiNx film so that diffraction gratings having different periods are patterned at the positions where the DFB laser stripes 203 are to be formed. Next, etching is performed by using the patterned SiNx film as a mask, so that the diffraction gratings are formed on the GaInAsP grating layer and all the GaInAsP grating layers in other regions are removed. Next, the mask of the SiNx film is removed, and a p-InP layer is deposited again.

Next, a SiNx film is deposited on the entire surface, and after that, patterning is performed on the SiNx film by using a photolithography technique so that the stripe pattern having a width wider than the DFB laser stripe 203 and the stripe pattern having a width wider than the semiconductor optical amplifier 210 are formed. Next, etching is performed by using the patterned SiNx film as an etching mask, so that the portion from a portion of the upper cladding layer 223 to the active layer 222 is removed. Next, by using the mask of the SiNx film as a selective growth mask in an MOCVD method or the like, the core layer 230 made of GaInAsP and the upper cladding layer 223 are grown in a butt-joint manner on the above-described removed region.

Next, the mask of the SiNx film is peeled off, and the upper cladding layer 224 and the contact layer 225 are layered in this order by using an MOCVD method or the like.

Next, a SiNx film is deposited on the entire surface, and after that, patterning is performed on the SiNx film by using a photolithography technique. Next, etching is performed on the portions corresponding to the sides of the DFB laser stripes 203, the curved waveguides 204, the MMI optical coupler 205, and the semiconductor optical amplifier 210 by using the patterned SiNx film as an etching mask in a well-known etching method. Accordingly, a ridge waveguide structure is formed.

Subsequently, a SiNx film which is to be an insulating film 226 is deposited on the entire surface, and after that, spin coating with the planarizing polymer 227 is performed. Next, by using a photolithography technique, patterning is performed on the planarizing polymer 227, so that the planarizing polymer 227 is allowed to remain only in the portions corresponding to the sides of the DFB laser stripes 203, the curved waveguides 204, the MMI optical coupler 205, and the semiconductor optical amplifier 210.

Next, after the planarizing polymer 227 is cured, the insulating film 226 is removed form only the portion where the p-side electrode is to be formed. In addition, the p-side electrode 228 is formed. Next, the substrate 220 is polished so as to become thin down to a predetermined thickness, and the n-side electrode 229 is deposited on the rear surface of the substrate 220.

Next, the light output facet 202 is formed by cleaving the epitaxial substrate, and a low reflection film is formed on the light output facet 202. Next, elements aligned in the direction perpendicular to the cleaved facets are separated one by one. Accordingly, the integrated semiconductor laser element 200 is achieved.

In the integrated semiconductor laser element 200 according to the second embodiment, each of the optical waveguides of the DFB laser stripes 203, the curved waveguides 204, the MMI optical coupler 205, and the semiconductor optical amplifier 210 is configured as a ridge waveguide. In the case of the ridge waveguide, as explained in the above-described example of the method of manufacturing the integrated semiconductor laser element 200, a burying process as a process greatly depending on the crystal orientation does not exist among the manufacturing processes. Like the second embodiment, if the flared portion is configured to be disposed at the downstream side of the curved portion, the flared portion is also inclined with respect to the <110> direction, so that the length of the optical waveguide inclined with respect to the crystal orientation is relatively increased. Like this, in the case where the length of the optical waveguide inclined with respect to the crystal orientation is large, if the configuration of the second embodiment using the ridge waveguide which does not require a burying process is employed, the manufacturing can be easily performed, and the embodiment is very appropriate in that the direction where the optical waveguide is to be formed with respect to the crystal orientation can be selected at a high degree of freedom.

Next, a third embodiment of the present invention will be described. A semiconductor optical element module according to the third embodiment is a semiconductor laser module including the integrated semiconductor laser element according to the second embodiment.

Figure 8:
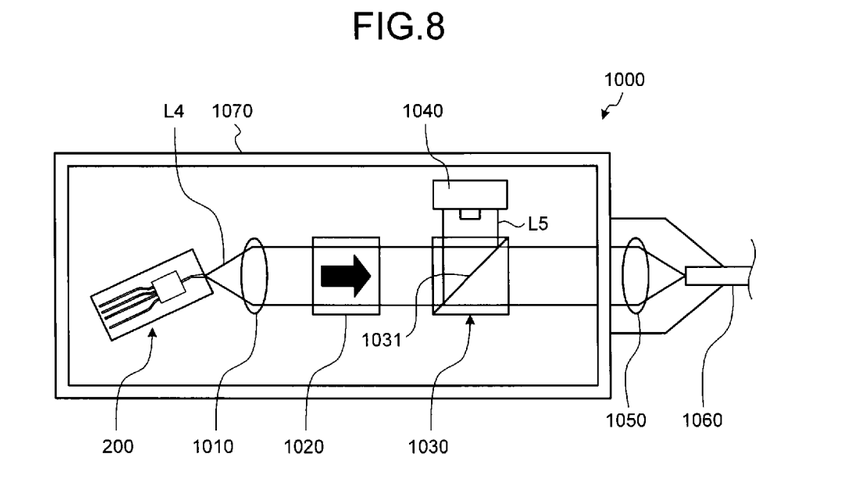
FIG. 8 is a schematic plan cross-sectional view illustrating a semiconductor laser module according to a third embodiment.

FIG. 8 is a schematic plan cross-sectional view illustrating a semiconductor laser module according to the third embodiment. As illustrated in FIG. 8, a semiconductor laser module 1000 is configured to include the integrated semiconductor laser element 200 according to the second embodiment, a collimating lens 1010, an optical isolator 1020, a beam splitter 1030, a power monitor PD (photo detector) 1040, a condensing lens 1050, an optical fiber 1060, and a case 1070 which retains the integrated semiconductor laser element 200, the collimating lens 1010, the optical isolator 1020, the beam splitter 1030, the power monitor PD 1040, and the condensing lens 1050 and into which the optical fiber 1060 is inserted.

The integrated semiconductor laser element 200 outputs laser light L4 having a wavelength corresponding to the driven DFB laser stripe. The collimating lens 1010 converts the laser light L4 into a parallel light beam. The optical isolator 1020 passes the laser light L4 as a parallel light beam toward the right side of the paper. The optical isolator 1020 prevents light from being input from the left direction of the paper to the collimating lens 1010 side. The beam splitter 1030 is configured to include a reflection plane 1031 to pass most of the laser light L4 passing through the optical isolator 1020 and to reflect laser light L5 as a portion of the laser light L4 to be split. The power monitor PD 1040 detects the laser light L5 split by the beam splitter 1030 and outputs a current in response to the detected optical power. The current output from the power monitor PD 1040 is input to a control unit (not shown) to be used to control the output of the integrated semiconductor laser element 200.

The condensing lens 1050 condenses the laser light L4 passing through the beam splitter 1030 so as to be coupled with the optical fiber 1060. The coupled laser light L4 is propagated through the optical fiber 1060. The propagated laser light L4 is used as signal light or the like.

The semiconductor laser module 1000 according to the third embodiment is configured to include the integrated semiconductor laser element 200 which outputs the laser light L4 having a good beam pattern. Therefore, it is possible to obtain a semiconductor laser module which is easy to assemble and has high energy efficiency due to high efficiency of coupling to the optical fiber 1060.

Hereinbefore, although the embodiments of the present invention have been described, the present invention is not limited by the description and the drawings forming portions of disclosure of the above embodiments. It may be obvious to the ordinarily skilled in the art that various substitutional embodiments, examples, and operational techniques are available from the disclosure.

For example, in the above-described configuration of the first embodiment, even when the single mode portion 115a of the flared portion 115 is configured as a curved waveguide, it is possible to obtain the effect of the present invention. In this case, the output-side curved portion 114 may be omitted.

In addition, the integrated semiconductor laser element 200 according to the second embodiment may further include a stray light waveguide mesa disclosed in Japanese Laid-open Patent Publication No. 2011-233829 by the inventors of the present invention. In the case where the stray light waveguide mesa is included, since the radiated light is absorbed during the propagation through the stray light waveguide mesa, it is possible to obtain light in a better beam pattern.

In the above-described embodiments, materials of the compound semiconductor and the electrodes and the like, dimensions, and the like are set suitable for the wavelength band of 1.55 μm. However, the materials, dimensions, and the like are appropriately set according to the wavelength of input light, and are not particularly limited.

In addition, in the above-described embodiments, although the optical waveguide includes the active layer, the active layer may be included only in a portion of the optical waveguide. The present invention may be widely applied, not only to the configuration including the active layer, but also to semiconductor optical elements having an optical waveguide including flared portions and curved portions.

In addition, an appropriate combination of the above-described components also belongs to the present invention. For example, the semiconductor optical amplification element according to the first embodiment may be configured in a ridge waveguide. In addition, for example, a high reflection film may be formed on the light input facet 101 of the semiconductor optical amplification element 100 according to the first embodiment, and the element may be used as a semiconductor light emitting element. In addition, the integrated semiconductor laser element 200 according to the third embodiment is replaced with the above-described semiconductor light emitting element, and the optical fiber 1060 is replaced with an optical fiber grating as an external oscillator, so that a semiconductor laser element module can be configured.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor optical element comprising an optical waveguide formed on a semiconductor substrate, wherein the optical waveguide includes:
    a single mode guide portion which guides input light in a single mode;
    a curved portion which is disposed at a downstream side of the single mode guide portion in a waveguide direction of the light and guides the light in a single mode; and
    a flared portion which is disposed at a downstream side of the curved portion in the waveguide direction and of which waveguide width is widened toward the waveguide direction, so that the flared portion can guide the light in a single mode at an input side of the light and the flared portion can guide the light in a multi-mode at an output side of the light,
    each of the single mode guide portion, the curved portion and the flared portion includes an active layer, and
    the input light is optically-amplified by the active layers in the single mode guide portion, the curved portion and the flared portion by an optically-amplifying effect of the active layers.

2. The semiconductor optical element according to claim 1, wherein optical waveguide is formed on a (001) plane which is a principal surface of the semiconductor substrate, the single mode guide portion extends along the <110> direction of the semiconductor substrate, and the flared portion is formed so as to be inclined with respect to the <110> direction of the semiconductor substrate.

3. The semiconductor optical element according to claim 1, wherein the output side of the light of the optical waveguide is a cleaved facet of the semiconductor substrate.

4. The semiconductor optical element according to claim 1, wherein the optical waveguide is configured as a ridge waveguide.

5. The semiconductor optical element according to claim 1, which is a semiconductor optical amplification element.

6. The semiconductor optical element according to claim 1, which is a semiconductor light emitting element.

7. An integrated semiconductor optical element comprising a semiconductor optical element, the semiconductor optical element comprising an optical waveguide formed on a semiconductor substrate, wherein the optical waveguide includes:
    a single mode guide portion which guides input light in a single mode;
    a curved portion which is disposed at a downstream side of the single mode guide portion in a waveguide direction of the light and guides the light in a single mode; and
    a flared portion which is disposed at a downstream side of the curved portion in the waveguide direction and of which waveguide width is widened toward the waveguide direction, so that the flared portion can guide the light in a single mode at an input side of the light and the flared portion can guide the light in a multi-mode at an output side of the light,
    each of the single mode guide portion, the curved portion and the flared portion includes an active layer, and
    the input light is optically-amplified by the active layers in the single mode guide portion, the curved portion and the flared portion by an optically-amplifying effect of the active layers.

8. The integrated semiconductor optical element according to claim 7, which is a semiconductor laser element.

9. A semiconductor optical element module comprising a semiconductor optical element, the semiconductor optical element comprising an optical waveguide formed on a semiconductor substrate, wherein the optical waveguide includes:
    a single mode guide portion which guides input light in a single mode;
    a curved portion which is disposed at a downstream side of the single mode guide portion in a waveguide direction of the light and guides the light in a single mode; and
    a flared portion which is disposed at a downstream side of the curved portion in the waveguide direction and of which waveguide width is widened toward the waveguide direction, so that the flared portion can guide the light in a single mode at an input side of the light and the flared portion can guide the light in a multi-mode at an output side of the light,
    each of the single mode guide portion, the curved portion and the flared portion includes an active layer, and
    the input light is optically-amplified by the active layers in the single mode guide portion, the curved portion and the flared portion by an optically-amplifying effect of the active layers.

* * * * *